US008797239B2

United States Patent
Yoon et al.

(10) Patent No.: US 8,797,239 B2
(45) Date of Patent: Aug. 5, 2014

(54) ORGANIC LIGHT-EMITTING DISPLAY DEVICE

(75) Inventors: Seok-Gyu Yoon, Yongin (KR);
 Kyu-Hwan Hwang, Yongin (KR);
 Jae-Heung Ha, Yongin (KR);
 Young-Woo Song, Yongin (KR);
 Jong-Hyuk Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 295 days.

(21) Appl. No.: 13/064,144

(22) Filed: Mar. 8, 2011

(65) Prior Publication Data
 US 2011/0221661 A1    Sep. 15, 2011

(30) Foreign Application Priority Data

Mar. 9, 2010  (KR) .......................... 10-2010-0021021

(51) Int. Cl.
 *G09G 3/30* (2006.01)
 *H01L 29/08* (2006.01)
 *H01L 29/04* (2006.01)
 *G02F 1/1333* (2006.01)

(52) U.S. Cl.
 USPC ................... 345/76; 257/40; 257/59; 257/72; 349/110

(58) Field of Classification Search
 USPC ....... 345/76; 313/504; 349/110, 111; 257/59, 257/91
 See application file for complete search history.

(56) References Cited

U.S. PATENT DOCUMENTS

| 5,818,552 | A | * | 10/1998 | Sato ................................. 349/43 |
| 7,916,259 | B2 | * | 3/2011 | Kawashima et al. ......... 349/141 |
| 8,299,702 | B2 | * | 10/2012 | Choi et al. .................... 313/503 |
| 2003/0067570 | A1 | * | 4/2003 | Okamoto et al. ............. 349/113 |
| 2004/0125325 | A1 | * | 7/2004 | Murai et al. .................. 349/187 |
| 2007/0069995 | A1 | * | 3/2007 | Shin et al. ........................ 345/76 |
| 2007/0108899 | A1 | | 5/2007 | Jung et al. |
| 2009/0302751 | A1 | * | 12/2009 | Hanawa ........................ 313/504 |
| 2010/0002175 | A1 | * | 1/2010 | Kim et al. ..................... 349/115 |
| 2011/0012816 | A1 | * | 1/2011 | Kang et al. ...................... 345/76 |
| 2011/0147770 | A1 | * | 6/2011 | Hwang et al. ................... 257/89 |
| 2011/0163664 | A1 | * | 7/2011 | Kang et al. .................... 313/504 |
| 2011/0175097 | A1 | * | 7/2011 | Song et al. ....................... 257/59 |
| 2011/0207254 | A1 | * | 8/2011 | Lee ................................. 438/34 |

FOREIGN PATENT DOCUMENTS

| JP | 10-039757 A | 2/1998 |
| JP | 2001-341336 A | 12/2001 |
| JP | 2005-345946 A | 12/2005 |

(Continued)

OTHER PUBLICATIONS

Korean Notice of Allowance in KR 10-2010-0021021, dated May 18, 2012 (Yoon, et al.).

*Primary Examiner* — Joe H Cheng
*Assistant Examiner* — Benyam Ketema
(74) *Attorney, Agent, or Firm* — Lee & Morse, P.C.

(57) ABSTRACT

An organic light-emitting display device includes a substrate, the substrate having a plurality of transmitting regions, a plurality of thin film transistors, a plurality of conductive lines, a passivation layer, a plurality of pixel electrodes on the passivation layer, an opposite electrode facing the plurality of pixel electrodes, an organic layer disposed among the plurality of pixel electrodes and the opposite electrode, and a plurality of masking films disposed in the plurality of transmitting regions.

20 Claims, 10 Drawing Sheets

(56) References Cited

FOREIGN PATENT DOCUMENTS

| | | | |
|---|---|---|---|
| JP | 2006-128241 | * | 5/2006 |
| KR | 10 2005-0103808 A | | 11/2005 |
| KR | 10 2005-0122691 A | | 12/2005 |
| KR | 10 2007-0021568 A | | 2/2007 |
| KR | 10-0696671 B1 | | 3/2007 |
| KR | 10 2008-0025500 A | | 3/2008 |
| KR | 10 2008-0051220 A | | 6/2008 |

* cited by examiner

ORGANIC LIGHT-EMITTING DISPLAY DEVICE

BACKGROUND

1. Field

Embodiments relate to an organic light-emitting display device.

2. Description of the Related Art

Applications of organic light-emitting display devices range from personal portable devices, such as MP3 players and mobile phones, to television sets, owing to having superior characteristics, such as wide viewing angles, high contrast ratios, short response times, and low amounts of power consumption.

An organic light-emitting display device has self-light emitting characteristics, and the weight and thickness of the organic light-emitting display device can be reduced since the organic light-emitting display device does not require an additional light source, unlike a liquid crystal display device. Also, an organic light-emitting display device can be formed to be a transparent display device by having transparent thin film transistors and transparent organic light-emitting devices.

SUMMARY

It is a feature of an embodiment to provide a transparent organic light-emitting display device configured to prevent distortion of an image transmitted therethrough by preventing the scattering of light transmitted therethrough.

At least one of the above and other features and advantages may be realized by providing an organic light-emitting display device, including a substrate, the substrate having a plurality of transmitting regions and having a plurality of pixel regions separated from each other by the transmitting regions interposed between the pixel regions, a plurality of thin film transistors, the thin film transistors being respectively disposed in the plurality of pixel regions, a plurality of conductive lines disposed to cross the plurality of transmitting regions, the conductive lines being respectively electrically connected to the plurality of thin film transistors, a passivation layer covering the plurality of thin film transistors and the plurality of conductive lines, a plurality of pixel electrodes on the passivation layer, the pixel electrodes being respectively electrically connected to the plurality of thin film transistors and disposed in the plurality of pixel regions, and overlapping with the plurality of thin film transistors so as to cover the plurality of thin film transistors, an opposite electrode facing the plurality of pixel electrodes, the opposite electrode being configured to allow light to pass therethrough, and disposed in all the plurality of transmitting regions and the plurality of pixel regions, an organic layer disposed among the plurality of pixel electrodes and the opposite electrode, the organic layer including an emission layer, and a plurality of masking films disposed in the plurality of transmitting regions to overlap with the plurality of conductive lines so as to cover the plurality of conductive lines, the masking films being electrically insulated from the plurality of conductive lines.

An area of each of the plurality of pixel electrodes may be equal to an area of one of the plurality of pixel regions.

At least one of the plurality of conductive lines may overlap with the plurality of pixel electrodes, respectively.

A ratio of an area of the plurality of transmitting regions to an overall area of the plurality of transmitting regions and the plurality of pixel regions may be about 5% to about 90%.

The passivation layer may be formed of a transparent material.

The pixel electrodes may be reflection type electrodes.

The masking films may be formed of a metal material.

The masking films may be disposed on the passivation layer to be separated from the plurality of pixel electrodes.

The organic light-emitting display device may further include a plurality of transmitting windows disposed adjacent to at least one of the plurality of pixel electrodes between adjacent masking films.

At least one of the above and other features and advantages may also be realized by providing an organic light-emitting display device, including a substrate, the substrate having a plurality of transmitting regions and having a plurality of pixel regions separated from each other by the transmitting regions interposed between the pixel regions, a plurality of pixel circuit units on the substrate, each of the pixel circuits including at least one thin film transistor, the pixel circuit units being respectively positioned in the plurality of pixel regions, a plurality of conductive lines disposed to cross the plurality of transmitting regions, the conductive lines being respectively electrically connected to the plurality of pixel circuit units, a first insulating layer covering the plurality of pixel circuit units and the plurality of conductive lines, the first insulating layer being disposed in all the plurality of transmitting regions and the plurality of pixel regions, a plurality of pixel electrodes on the first insulating layer, the pixel electrodes being respectively electrically connected to the plurality of pixel circuit units, and overlapping with the plurality of pixel circuit units so as to cover the plurality of pixel circuit units, an opposite electrode facing the plurality of pixel electrodes, the opposite electrode being configured to allow light to pass therethrough, and disposed in all the plurality of transmitting regions and the plurality of pixel regions, an organic layer disposed among the plurality of pixel electrodes and the opposite electrode, the organic layer being configured to emit light, and a plurality of masking films disposed in the plurality of transmitting regions to overlap with the plurality of conductive lines so as to cover the plurality of conductive lines, the masking films being electrically insulated from the plurality of conductive lines.

The pixel electrodes may be disposed in the plurality of pixel regions, respectively.

At least one of the plurality of conductive lines may be disposed to cross the plurality of pixel regions.

A ratio of an area of the plurality of transmitting regions to an overall area of the plurality of transmitting regions and the plurality of pixel regions may be about 5% to about 90%.

The first insulating layer and a plurality of second insulating layers may be disposed in the plurality of transmitting regions and the plurality of pixel regions, and the first insulating layer and the plurality of second insulating layers may be formed of a transparent material.

The pixel electrodes may be reflection type electrodes.

The masking films may be formed of a metal material.

The masking films may be disposed on the first insulating layer to be separated from the plurality of pixel electrodes.

The organic light-emitting display device may further include a plurality of transmitting windows disposed adjacent to at least one of the plurality of pixel electrodes between adjacent masking films.

BRIEF DESCRIPTION OF THE DRAWINGS

The above and other features and advantages will become more apparent to those of skill in the art by describing in detail example embodiments with reference to the attached drawings, in which.

DETAILED DESCRIPTION

Figure 1:
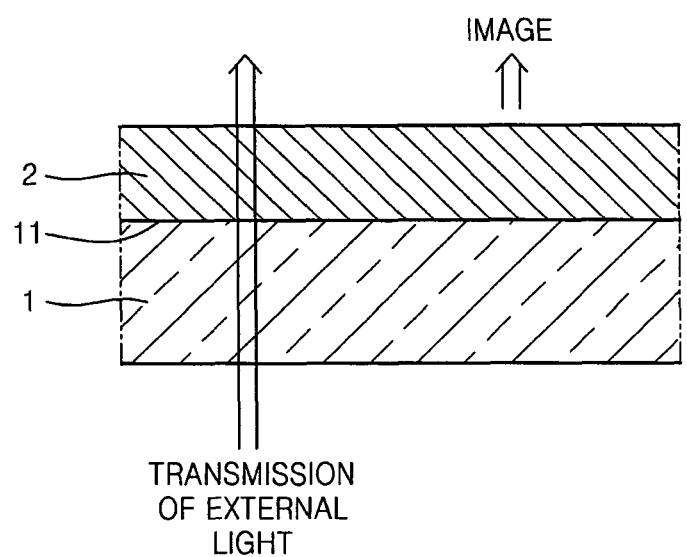
FIG. 1 illustrates a cross-sectional view of an organic light-emitting display device according to an embodiment.

Korean Patent Application No. 10-2010-0021021, filed on Mar. 9, 2010, in the Korean Intellectual Property Office, and entitled: "Organic Light-Emitting Display Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a cross-sectional view of an organic light-emitting display device according to an embodiment. Referring to FIG. 1, in the organic light-emitting display device, a display unit 2 may be formed on a first surface 11 of a substrate 1.

In the example embodiment illustrated in FIG. 1, when external light is incident on the organic light-emitting display device, the external light sequentially penetrates the substrate 1 and the display unit 2. As will be described below, the display unit 2 is formed to allow external light to penetrate therethrough. Referring to FIG. 1, the display unit 2 is formed in such a way that a user positioned at a side where an image is displayed can view an object below the substrate 1.

Figure 2:
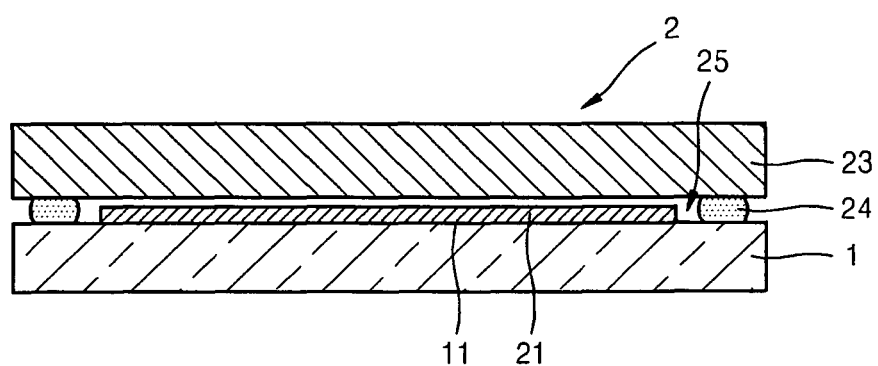
FIG. 2 illustrates a cross-sectional view showing details of the organic light-emitting display device of FIG. 1, according to an embodiment.

FIG. 2 illustrates a cross-sectional view showing details of the organic light-emitting display device of FIG. 1, according to an embodiment. The display unit 2 may include an organic emission unit 21 formed on the first surface 11 of the substrate 1, and a sealing substrate 23 for sealing the organic emission unit 21. The sealing substrate 23 may be formed of a transparent material to allow viewing of an image generated by the organic emission unit 21, and may prevent external air and moisture from penetrating into the organic emission unit 21.

Edges of the sealing substrate 23 and the substrate 1 may be sealed by a sealant 24, thereby sealing a space 25 between the substrate 1 and the sealing substrate 23. The space 25 may be filled with an absorbent or a filler.

Figure 3:
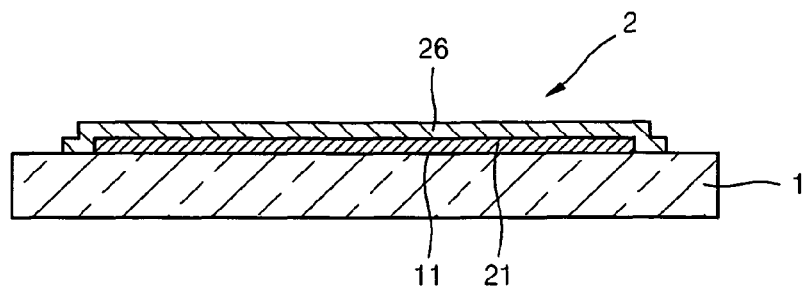
FIG. 3 illustrates a cross-sectional view showing details of the organic light-emitting display device of FIG. 1, according to another embodiment.

FIG. 3 illustrates a cross-sectional view showing details of the organic light-emitting display device of FIG. 1, according to another embodiment. Referring to FIG. 3, a thin sealing film 26 may be formed on the organic emission unit 21 instead of the sealing substrate 23 of FIG. 2 to protect the organic emission unit 21 from external air. The thin sealing film 26 may have a structure in which a film formed of an inorganic material, such as a silicon oxide or a silicon nitride, and a film formed of an organic material, such as epoxy or polyimide, are alternately stacked. However, the thin sealing film 26 is not limited thereto. For example, the thin sealing film 26 may have any thin film type sealing structure.

Figure 4:
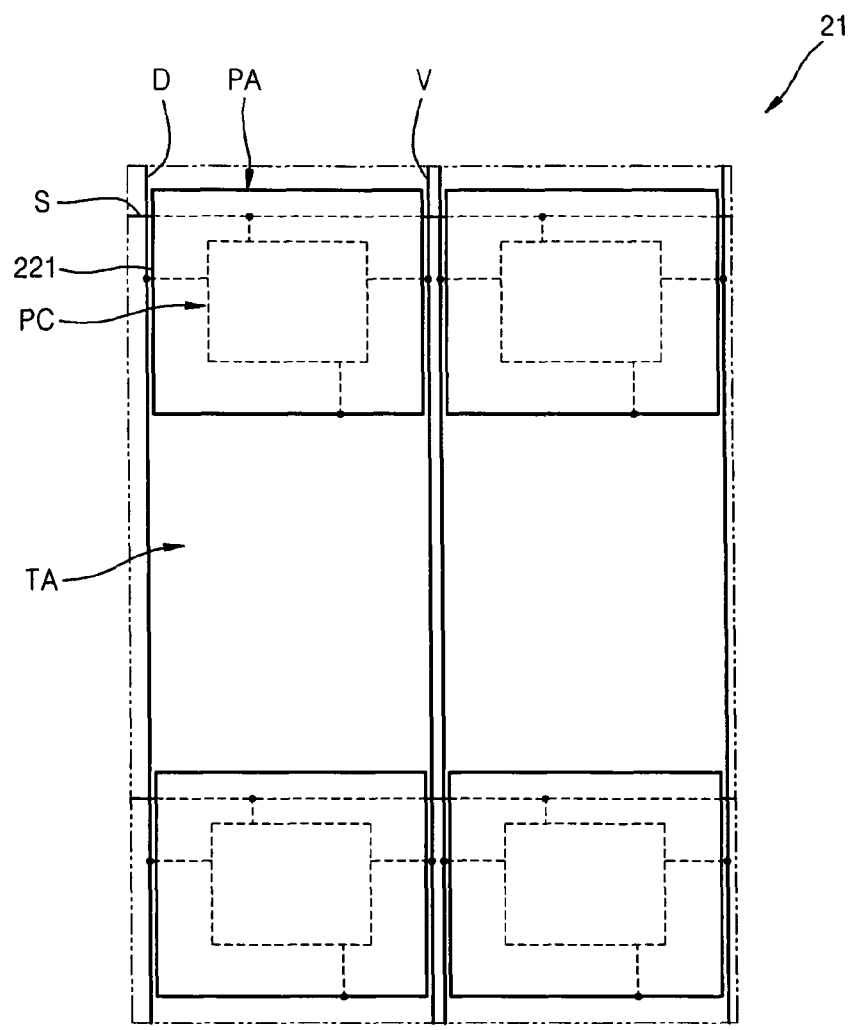
FIG. 4 illustrates a schematic drawing showing an organic emission unit illustrated in FIG. 2 or 3, according to an embodiment.
Figure 5:
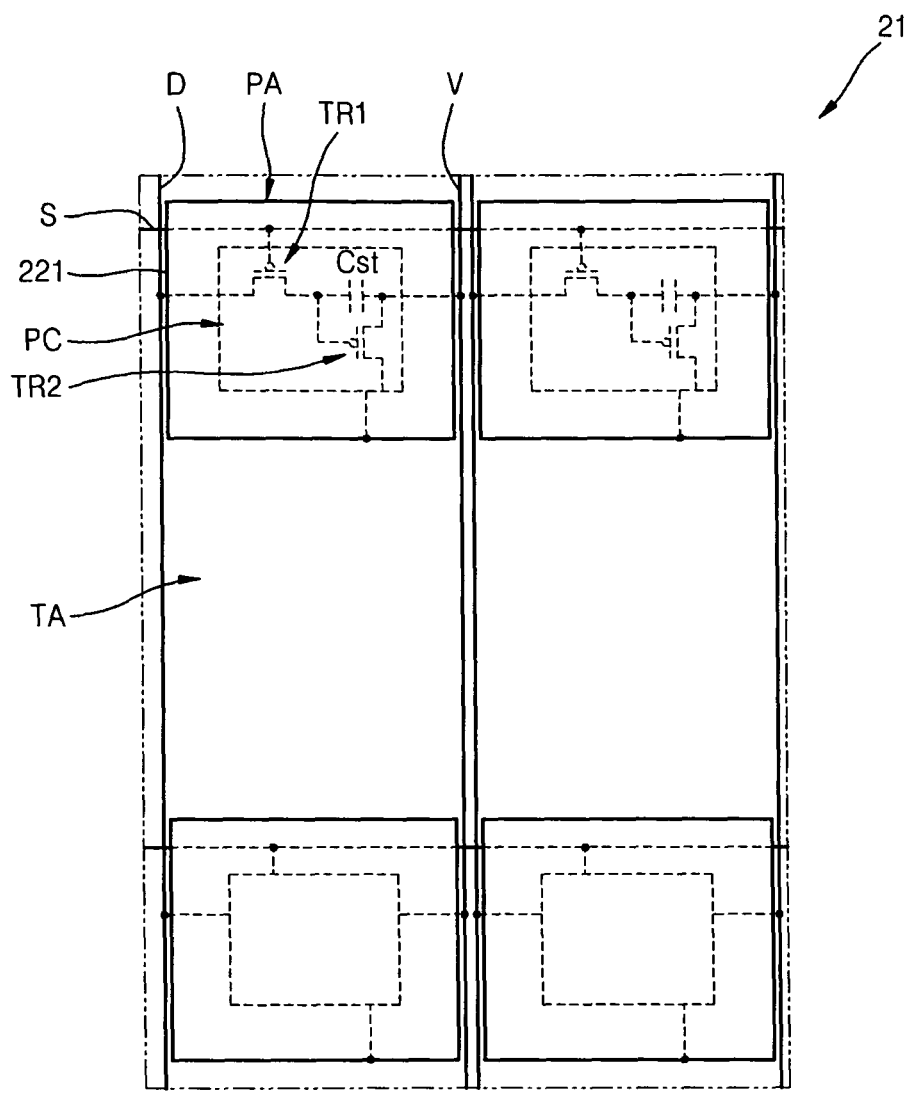
FIG. 5 illustrates a schematic drawing of a plurality of pixel circuit units included in the organic emission unit of FIG. 4, according to an embodiment.

FIG. 4 illustrates a schematic drawing showing an organic emission unit 21 illustrated in FIG. 2 or 3, according to an embodiment. FIG. 5 illustrates a schematic drawing of a plurality of pixel circuit units PC included in the organic emission unit of FIG. 4, according to an embodiment. Referring to FIGS. 2 through 5, according to an embodiment, the organic emission unit 21 may be formed on the substrate 1, on which are defined transmitting regions TA (for transmitting external light), as well as pixel regions PA separated from each other and having the transmitting regions TA interposed therebetween.

Referring to FIG. 4, each of the pixel regions PA may include a pixel circuit unit PC, and a plurality of conductive lines, such as a scan line S, a data line D, and a Vdd line V, are electrically connected to the pixel circuit unit PC. Although not shown, various other conductive lines besides the scan line S, the data line D, and the Vdd line V may further be connected to the pixel circuit unit PC according to the configuration of the pixel circuit unit PC.

Referring to FIG. 5, the pixel circuit unit PC may include a first thin film transistor (TFT) TR1 connected to the scan line S and the data line D, a second TFT TR2 connected to the first TFT TR1 and the Vdd line V, and a capacitor Cst connected to the first and second TFTs TR1 and TR2. The first TFT TR1 may be a switching transistor and the second TFT TR2 may be a driving transistor. The second TFT TR2 may be electrically connected to a pixel electrode 221. In the example shown in FIG. 5, the first and second TFTs TR1 and TR2 are illustrated as P-type transistors. However, they are not limited thereto, and one or more of the first and second TFTs TR1 and TR2 may be an N-type transistor. Further, the present embodiment is not limited to the first and second TFTs TR1 and TR2 and the capacitor Cst. For example, more than two TFTs and more than one capacitor may be included in the pixel circuit unit PC according to the configuration of the pixel circuit unit PC.

Referring to FIGS. 4 and 5, the scan line S may be disposed to overlap with the pixel electrode 221. However, the present embodiment is not limited thereto. For example, one or more of the conductive lines including the scan line S, the data line D, and the Vdd line V may be disposed to overlap with the pixel electrode 221. In some cases, all the conductive lines including the scan line S, the data line D, and the Vdd line V may be disposed to overlap with or adjacent to the pixel electrode 221.

In the present embodiment, the pixel regions PA are separated from the transmitting regions TA. Thus, it is possible to prevent external image distortion caused by scattering of external light due to the patterns of devices in the pixel circuit units PC when a user looks through the transmitting regions TA.

The transmitting regions TA and the pixel regions PA may be formed in such a way that the ratio of the area of the transmitting regions TA to the overall area of the transmitting regions TA and the pixel regions PA is about 5% to about 90%. If the ratio of the area of the transmitting regions TA to the overall area of the transmitting regions TA and the pixel regions PA is less than about 5%, then the user may find it difficult to see an object or image on a side opposite to the user due to lack of light transmitted through the display unit 2 of FIG. 1 when the display 2 unit is in an off-state. Thus, the display unit 2 may not appear to be transparent. If the ratio of the area of the transmitting regions TA to the overall area of the transmitting regions TA and the pixel regions PA is about 5%, then the pixel regions PA may be present in an island state with respect to the transmitting regions TA, and scattering of solar light may be minimized with most of conductive patterns disposed in the pixel regions PA. Thus, the display unit 2 may appear to be a transparent display to a user. As will be described below, when a TFT included in the pixel circuit unit PC is a transparent TFT, such as an oxide semiconductor, and an organic light emitting device is a transparent device, the display unit 2 may be a highly transparent display unit.

If the ratio of the area of the transmitting regions TA to the entire area of the pixel regions PA and the transmitting regions TA is greater than about 90%, then pixel integrity of the display unit 2 may be reduced. Thus, a stable image may not be realized through light emission from the pixel regions PA. That is, as the area of the pixel regions PA is reduced, the brightness of light emitted from an organic layer 223, which will be described below, may need to be increased in order to realize an image. However, if the organic light emitting device is operated to emit light having a high brightness, the lifetime of the organic light emitting device may be rapidly reduced. Also, when the ratio of the area of the transmitting regions TA to the entire area of the pixel regions PA and the transmitting regions TA is greater than about 90%, while the size of a single pixel region PA is maintained at an appropriate size, the number of pixel regions PA may be reduced, and the resolution of the organic light emitting device may be reduced accordingly.

According to an embodiment, the ratio of the area of the transmitting regions TA to the entire area of the pixel regions PA and the transmitting regions TA may be about 20% to about 70%. If the ratio of the area of the transmitting regions TA to the entire area of the pixel regions PA and the transmitting regions TA is less than about 20%, the ratio of the area of the transmitting regions TA to the area of the pixel regions PA may be small. Thus, observing of an external image through the transmitting regions TA may be limited. If the ratio of the area of the transmitting regions TA to the entire area of the pixel regions PA and the transmitting regions TA exceeds about 70%, there may be limitations in designing the pixel circuit unit PC.

Each of the pixel regions PA may includes the pixel electrode 221 electrically connected to the pixel circuit unit PC. The pixel circuit unit PC may overlap with the pixel electrode 221 so that the pixel circuit unit PC may be covered by the pixel electrode 221. Also, one or more of the conductive lines including the scan line S, the data line D, and the Vdd line V may be disposed to cross the pixel electrode 221. The conductive lines may reduce the transmittance of light less than the pixel circuit unit PC does. Thus, all the conductive lines may be disposed adjacent to the pixel electrode 221 according to design conditions. As will be described below in detail, the pixel electrode 221 may include a reflection layer formed of conductive metal that reflects light. Thus, the pixel electrode 221 may cover the pixel circuit unit PC overlapping with the pixel electrode 221 and prevent external image distortion caused by the pixel circuit unit PC in the pixel region PA.

Figure 6:
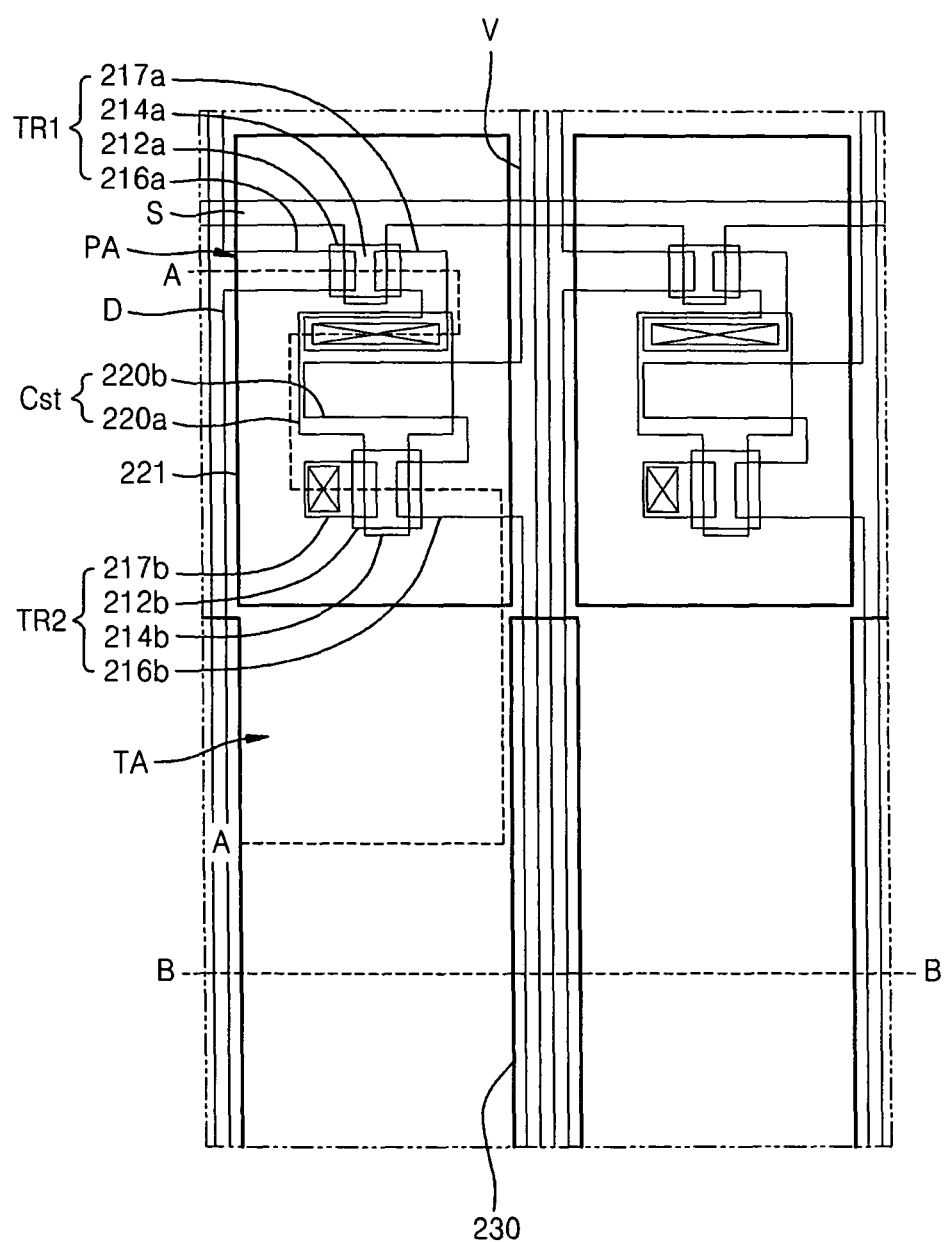
FIG. 6 illustrates a plan view specifically illustrating the organic emission unit of FIG. 5, according to an embodiment.
Figure 7:
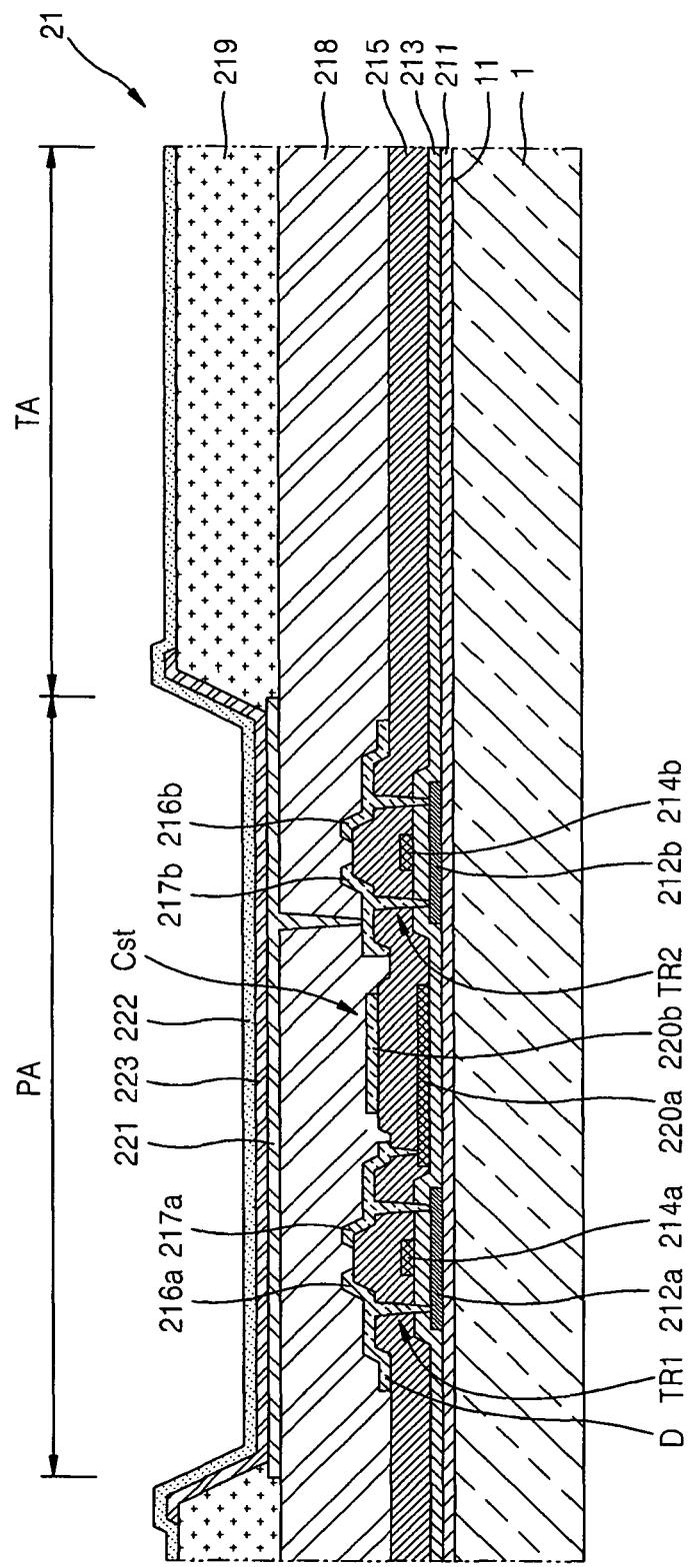
FIG. 7 illustrates a cross-sectional view taken along the line A-A of FIG. 6.
Figure 8:
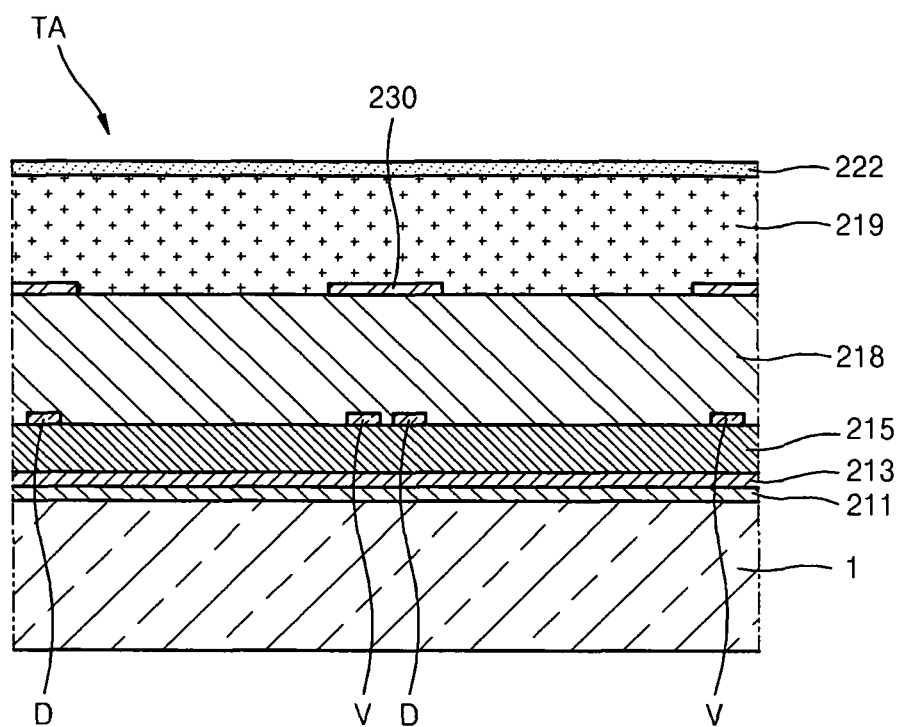
FIG. 8 illustrates a cross-sectional view taken along the line B-B of FIG. 6.

FIG. 6 illustrates a plan view specifically illustrating the organic emission unit 21 of FIG. 5, according to an embodiment. In FIG. 6, the pixel circuit unit PC of FIG. 5 is illustrated in detail. FIG. 7 illustrates a cross-sectional view taken along the line A-A of FIG. 6. FIG. 8 illustrates a cross-sectional view taken along the line B-B of FIG. 6.

Referring to FIGS. 6 to 8, according to an embodiment, a buffer layer 211 may be formed on the first surface 11 of the substrate 1, and the first TFT TR1, the capacitor Cst, and the second TFT TR2 may be formed on the buffer layer 211. For example, a first semiconductor active layer 212*a* and a second semiconductor active layer 212*b* may first be formed on the buffer layer 211.

The buffer layer 211 may prevent the penetration of impurities and external elements into the organic emission unit 21, and may planarize a surface of the organic emission unit 21. The buffer layer 211 may be formed of various materials that can perform the functions described above. For example, the buffer layer 21 may be formed of an inorganic material, such as a silicon oxide, a silicon nitride, a silicon oxynitride, an aluminum oxide, an aluminum nitride, a titanium oxide, or a titanium nitride, of an organic material, such as polyimide, polyester, or acryl, or of stacks of these materials. In another implementation, the buffer layer 211 may be omitted.

The first and second semiconductor active layers 212*a* and 212*b* may be formed of, e.g., polycrystalline silicon. However, the present embodiment is not limited thereto. For example, they may be formed of a semiconductor oxide. In an implementation, the semiconductor oxide of the first and second semiconductor active layers 212*a* and 212*b* may be a G-I—Z—O layer [$(In_2O_3)_a(Ga_2O_3)_b(ZnO)_c$ layer], where a, b, and c are integers that respectively satisfy a≥0, b≥0, and c≥0.

A gate insulating layer 213 may be formed on the buffer layer 211 to cover the first and second semiconductor active layers 212*a* and 212*b*. First and second gate electrodes 214*a* and 214*b* may be formed on the gate insulating layer 213. An interlayer insulating layer 215 may be formed on the gate insulating layer 213 to cover the first and second gate electrodes 214*a* and 214*b*. A first source electrode 216*a*, a first drain electrode 217*a*, a second source electrode 216*b*, and a second drain electrode 217*b* may each be formed on the interlayer insulating layer 215, and may be connected to the first semiconductor active layer 212*a* and the second semiconductor active layer 212*b* through contact holes, respectively.

The scan line S may be formed simultaneously with the first and second gate electrodes 214*a* and 214*b*. The data line D may be formed simultaneously with the first source electrode 216*a* to be connected to the first source electrode 216*a*. The Vdd line V may be formed simultaneously with the second source electrode 216*b* to be connected to the second source electrode 216*b*. In the capacitor Cst, a lower electrode 220*a* may be simultaneously formed with the first and second gate electrodes 214a and 214b, and an upper electrode 220b may be simultaneously formed with the first drain electrode 217a.

The structures of the first TFT TR1, the capacitor Cst, and the second TFT TR2 are not limited to those described above, and various types of TFT and capacitor structures may be employed. For example, each of the first and second TFTs TR1 and TR2 is shown as having a top gate structure, but they may have a bottom gate structure in which the first and second gate electrodes 214a and 214b are located below the first and second semiconductor active layers 212a and 212b, respectively. Further, other TFT structures may be employed.

A passivation layer 218 may be formed to cover the first TFT TR1, the capacitor Cst, and the second TFT TR2. The passivation layer 218 may be, e.g., a single layer or multiple layers of insulating layer, an upper surface of which may be planarized. The passivation layer 218 may be formed of, e.g., an inorganic material and/or an organic material.

Referring to FIGS. 6 and 7, a plurality of the pixel electrodes 221 may be formed on the passivation layer 218 to cover the first TFT TR1, the capacitor Cst, and the second TFT TR2. Each of the pixel electrodes 221 may be connected to the second drain electrode 217b of the second TFT TR2 through a via hole formed in the passivation layer 218. Referring to FIG. 6, the pixel electrodes 221 may be formed in an island pattern to be independent from each other.

A pixel defining layer 219 may be formed on the passivation layer 218 to cover edges of the pixel electrodes 221. An organic layer 223 and an opposite electrode 222 may be sequentially formed on each of the pixel electrodes 221. The opposite electrode 222 may be formed on all the pixel regions PA and on the transmitting regions TA.

The organic layer 223 may be, e.g., a low molecular weight organic layer or a polymer organic layer. If the organic layer 223 is a low molecular weight organic layer, then the organic layer 223 may be formed by stacking a hole injection layer (HIL), a hole transport layer (HTL), an emission layer (EML), an electron transport layer (ETL), and an electron injection layer (EIL) in a single structure or a composite structure. In this case, the organic layer 223 may be formed of various materials, such as copper phthalocyanine (CuPc), N,N'-di(naphthalene-1-yl)-N,N'-diphenyl-benzidine (NPB), or tris-8-hydroxyquinoline aluminum (Alq3). The low-molecular weight organic layer may be formed by, e.g., vacuum deposition. In this case, the EML may be formed independently for each of red, green, and blue pixels, and the HIL, the HTL, the ETL, and the EIL may be common layers that are commonly applied to the red, green, and blue pixels. For example, as illustrated in FIG. 7, the common layers may be formed to cover all the pixel regions PA and the transmitting regions TA, similar to the opposite electrode 222.

The pixel electrodes 221 may function as anode electrodes, and the opposite electrode 222 may function as a cathode electrode. In another implementation, the polarities of the pixel electrodes 221 and the opposite electrode 222 may be reversed.

The pixel electrode 221 may have a size corresponding to that of the pixel regions PA for each of the red, green, and blue pixels. In an embodiment, an area of each of the plurality of pixel electrodes 221 may be equal to an area of one of the plurality of pixel regions. The opposite electrode 222 may be formed as a common electrode covering all pixels of the organic emission unit 21.

In an embodiment, the pixel electrode 221 may be a reflection type electrode and the opposite electrode 222 may be a semi-transparent type electrode. In this case, the organic emission unit 21 may be a top emission type, in which light radiated from the emission layer is emitted toward the opposite electrode 222.

To this end, the pixel electrode 221 may include a reflection layer formed of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), a compound of these materials, and an oxide having a relatively high work function such as ITO, IZO, ZnO, or $In_2O_3$. The opposite electrode 222 may be formed of a metal having a relatively low work function such as Ag, Mg, Al, Pt, Pd, Au, Ni, Nd, Ir, Cr, Li, Ca, or an alloy thereof. The opposite electrode 222 may be formed of a thin layer so that the transmission thereof may be improved.

If the pixel electrode 221 is a reflection type electrode, then the pixel circuit unit PC disposed under the pixel electrode 221 may be covered by the pixel electrode 221. Thus, referring to FIG. 7, at upper outer sides of the opposite electrode 222, a user may not observe the patterns of the first TFT TR1, the capacitor Cst, and the second TFT TR2 disposed under the pixel electrode 221, and some of the conductive lines including the scan line S, the data line D, and the Vdd line V. Also, if the pixel electrode 221 is a reflection type electrode, then light may be emitted only toward the user, thereby reducing an amount of light lost in a direction opposite to the user. Also, the pixel electrode 221 may cover various patterns on the pixel circuit unit PC disposed under the pixel electrode 221, as described above. Thus, the user may view a clear image.

The present embodiment is not limited to the structure described above. For example, the pixel electrode 221 may be a transparent electrode. In this case, the pixel electrode 221 may be formed only of only an oxide having a relatively high work function, such as ITO, IZO, ZnO, or $In_2O_3$. If the pixel electrode 221 is transparent, at the upper outer sides of the opposite electrode 222, the user may not observe the patterns of the first TFT TR1, the capacitor Cst, and the second TFT TR2 disposed under the pixel electrode 221, and some the conductive lines including the scan line S, the data line D, and the Vdd line V. However, even if the pixel electrode 221 is transparent, there may be a loss of light. In particular, the transmittance of light therethrough may not be 100%. Thus, the transmittance of external light may be further reduced due to the pixel electrode 221 with the above conductive patterns disposed in the region of the pixel electrode 221. Therefore, interference due to the conductive patterns on the external light may be reduced as compared to when the external light directly enters the conductive patterns, thereby reducing distortion of an external image.

The passivation layer 218, the gate insulating layer 213, the interlayer insulating layer 215, and the pixel defining layer 219 may be formed of a transparent insulating layer. The passivation layer 218 may correspond to a first insulating layer. The gate insulating layer 213, the interlayer insulating layer 215, and the pixel defining layer 219 may correspond to a second insulating layer.

Some of the conductive lines including the scan line S, the data line D, and the Vdd line V may be disposed to cross the transmitting regions TA. Thus, the crossing conductive lines may act as multiple slits that cause a part of external light to scatter while the external light penetrates through the transmitting regions TA. Accordingly, light from an external image penetrating through the transmitting regions TA may distort and thereby even color separation may occur. Therefore, to avoid such, the present embodiment may include a plurality of a masking films 230 (or screening films) formed above the conductive lines crossing the transmitting regions TA so that the crossing conductive lines cannot act as multiple slits, thereby preventing external image distortion and color separation. This method is based on the same principle used to prevent external image distortion caused by complicated conductive patterns of the pixel circuit units PC covered by the pixel electrodes 221.

The masking films 230 may be disposed along a path in which external light penetrates through the transmitting regions TA. Thus, as illustrated in FIG. 8, the masking films 230 may be formed on the passivation layer 218 by using the same material used to form the pixel electrodes 221. Each of the masking films 230 may have a width great enough to cover the data line D and the Vdd line V disposed below the corresponding screening film 230.

In an implementation, the masking films 230 may be formed of the same material used to form the pixel electrodes 221. In another implementation, the masking films 230 may be formed of the same material used to form the first and second semiconductor active layers 212*a* and 212*b* on the buffer layer 211, or the same material used to form the first and second gate electrodes 214*a* and 214*b*. The masking films 230 may be formed of a material that reflects light so that a user cannot view the patterns of the data lines D and the power supply voltage lines V.

Although the transmittance of external light may be very low on locations where the masking films 230 are formed, the masking films 230 may cover only the data lines D and the power supply voltage lines V, which are very fine conductive lines. Thus, the overall transmittance of the organic light-emitting display device may be hardly influenced by the masking films 230, while occurrence of multiple slits caused by the patterns of these fine conductive lines may be prevented due to the masking films 230, thereby allowing a user to view a clear image.

Figure 9:
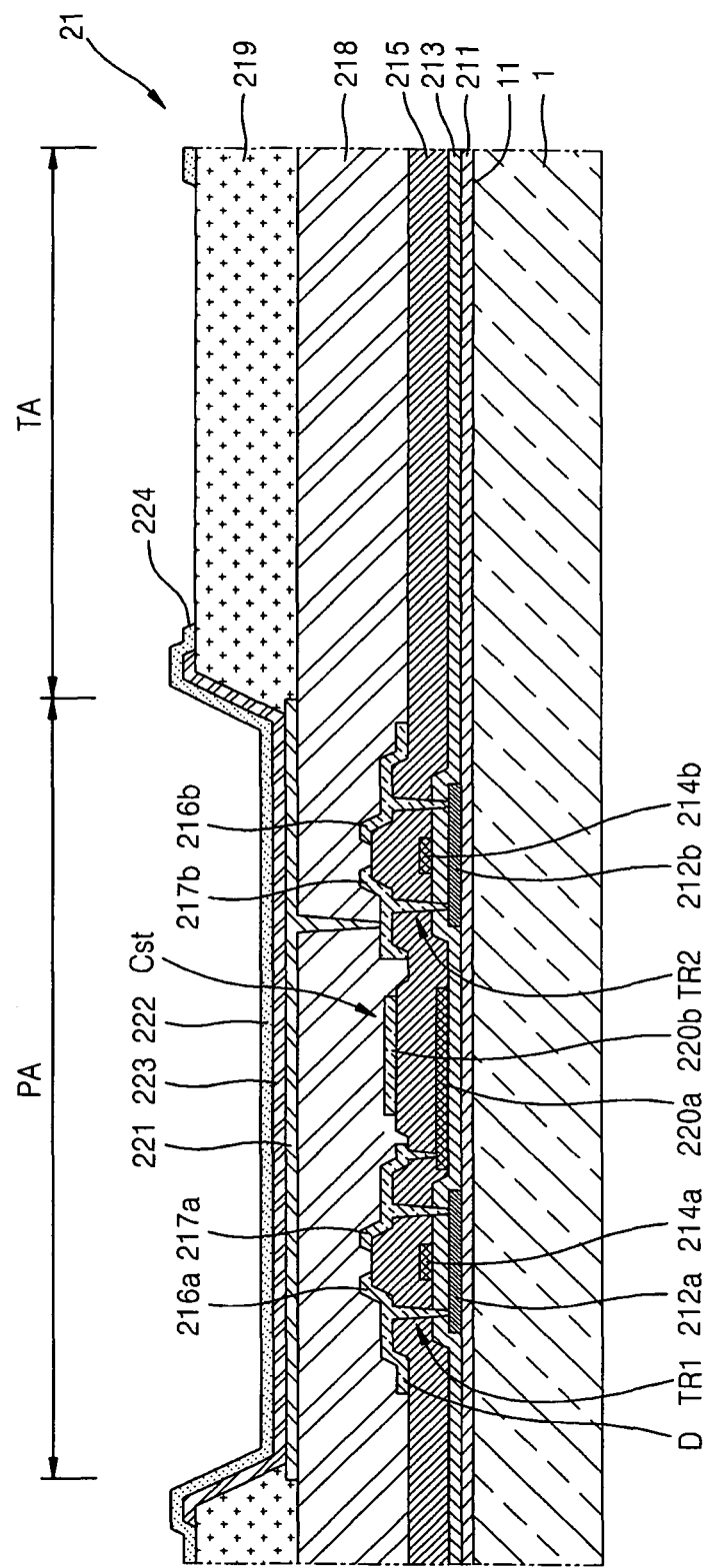
FIG. 9 illustrates a cross-sectional view of an organic emission unit according to another embodiment.

FIG. 9 illustrates a cross-sectional view of an organic emission unit 21 according to another embodiment. Referring to FIG. 9, in the organic emission unit 21, an additional transmitting window may be formed in an opposite electrode 222 in a transmitting region TA. Thus, in the transmitting region TA, a first transmitting window 224, which is an aperture, may be formed in at least one region of the opposite electrode 222.

In order to increase the transmittance of external light in the transmitting region TA, the transmitting region TA may be widened and/or may be formed of a material having a relatively higher transmittance. There may be limits to widening the transmitting region TA due to restrictions in the design of the pixel circuit unit PC. Accordingly, it may be preferable to increase the transmittance, e.g., the transmitting region TA may be formed of a material having a high transmittance in order to increase the transmittance of external light of the transmitting regions TA.

Even if an organic light-emitting display device is a top emission type, in which light from the emission layer is emitted toward an opposite electrode 222, increasing of the transmittance of external light may be limited. For example, in order to increase the transmittance of the opposite electrode 222, the opposite electrode 222 may be formed of metal and may be formed to be thin, or it may be formed of a metal oxide material having high conductivity. However, such an opposite electrode 222 may have a relatively high resistance, which is less desirable. In contrast, according to the present embodiment, the opposite electrode 222 may include the first transmitting window 224, which may significantly increase the transmittance of external light in the transmitting region TA.

The first transmitting window 224 may be formed as wide as possible in the transmitting region TA. In this case, the masking film 230 described above with reference to FIG. 8 may also be employed.

Figure 10:
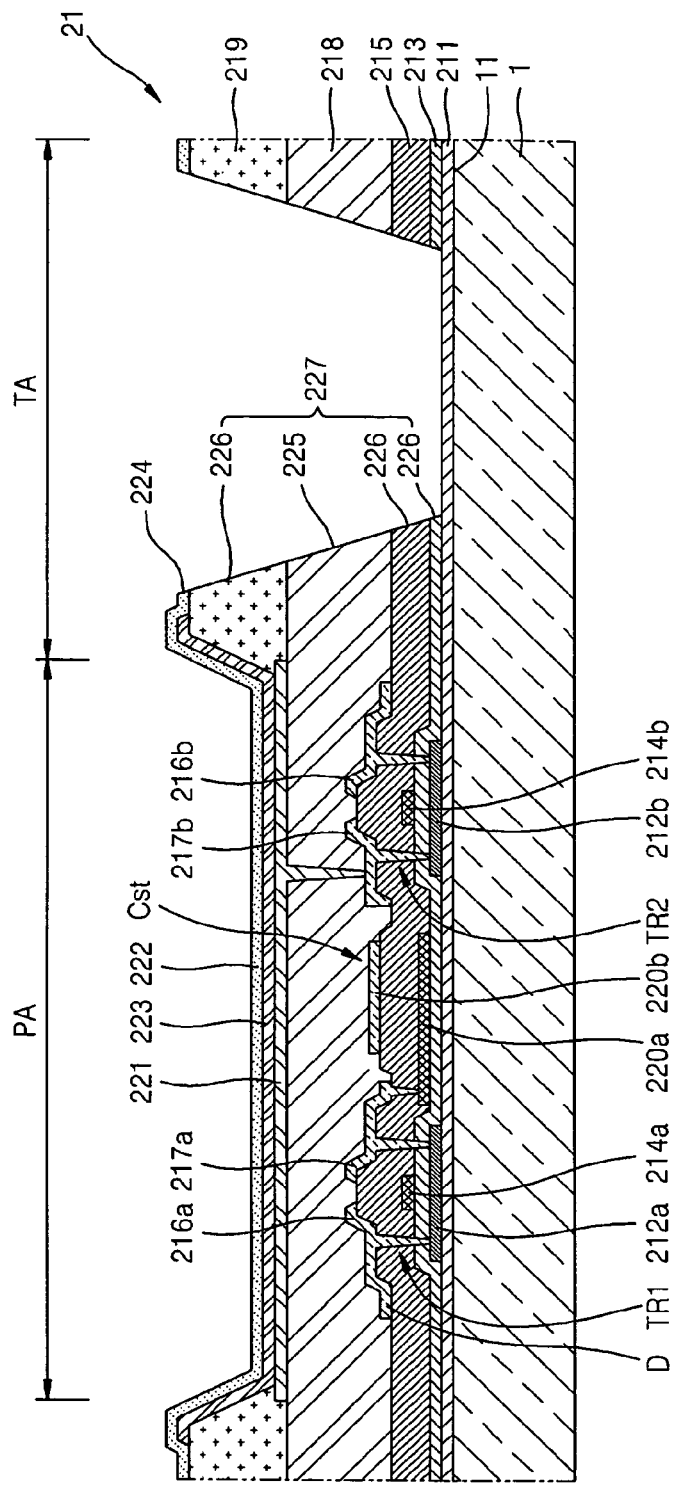
FIG. 10 illustrates a cross-sectional view of an organic emission unit according to another embodiment.

FIG. 10 illustrates a cross-sectional view of an organic emission unit 21 according to another embodiment. Compared to FIG. 9, in the organic emission unit 21 of FIG. 10, an additional transmitting window is further formed in each of insulating layers in a transmitting region TA.

The transmitting windows may be formed as wide as possible while avoiding interruption of the conductive lines including a scan line S, a data line D, and a Vdd line V. The transmitting windows may be connected to the first transmitting window 224.

For example, a second transmitting window 225 may be formed in a passivation layer 218 covering a pixel circuit unit PC, and third transmitting windows 226 may be formed in a gate insulating layer 213, an interlayer insulating layer 215, and a pixel defining layer 219, respectively. The second transmitting window 225 and the third transmitting windows 226 may form a fourth transmitting window 227.

Referring to FIG. 10, the fourth transmitting window 227 may not be extend to the buffer layer 211, in order to protect a substrate 1 from impurities coming from the outside. However, embodiments are not limited thereto and, in another implementation, the fourth transmitting window 227 may extend to the buffer layer 211.

When both the first transmitting window 224 and the fourth transmitting window 227 are formed in the transmitting region TA, the transmittance of external light in the transmitting region TA may be significantly increased, and a user may thus easily view an external image.

Figure 11:
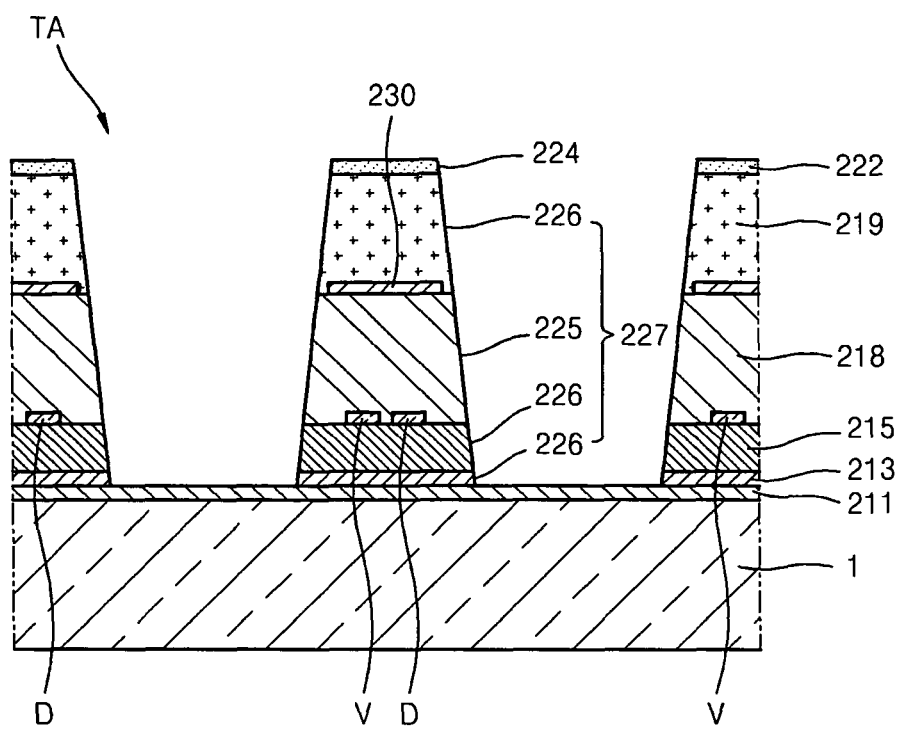
FIG. 11 illustrates a cross-sectional view of a transmitting region included in the organic emission unit of FIG. 10, according to an embodiment.

FIG. 11 illustrates a cross-sectional view of a transmitting region included in the organic emission unit 21 of FIG. 10, according to an embodiment. Referring to FIG. 11, the organic emission unit 21 may have the first and fourth transmitting windows 224 and 227. Further, a plurality of masking films 230 may be formed to cover data lines D and power supply voltage lines V.

Figure 12:
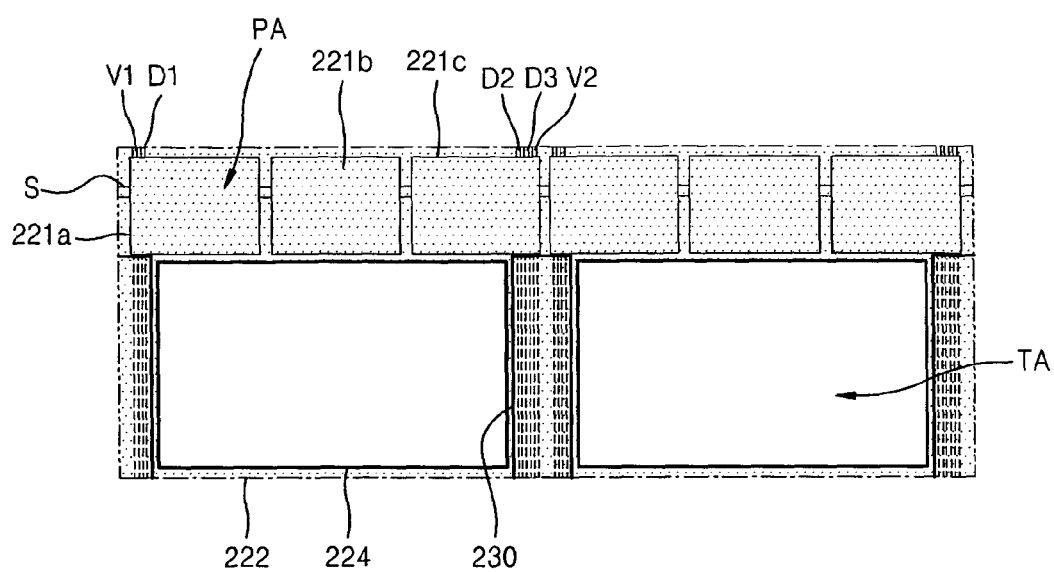
FIG. 12 illustrates a cross-sectional view of an organic emission unit according to another embodiment.

FIG. 12 illustrates a cross-sectional view of an organic emission unit according to another embodiment. Referring to FIG. 12, each of transmitting regions TA may be formed to correspond to a first pixel electrode 221*a*, a second pixel electrode 221*b*, and a third pixel electrode 221*c*. First to third data lines D1 to D3 may be electrically connected to the first to third pixel electrodes 221*a* to 221*c*, respectively. A first Vdd line V1 may be electrically connected to the first and second pixel electrodes 221*a* and 221*b*, and a second Vdd line V2 may be electrically connected to the third pixel electrode 221*c*. Thus, a large transmitting region TA may correspond to three sub pixels, e.g., red, green, and blue sub pixels. Accordingly, it may be possible to significantly improve the transmittance of the organic emission unit 21 and to reduce image distortion caused by scattering of light. Also, the opposite electrode 222 may include the first transmitting window 224, which is an aperture on a location corresponding to the transmitting region TA, thereby significantly improving the transmittance of the organic emission unit 21. Further, in the present embodiment, the conductive lines V1, V2, D1, D2, and D3 may be covered by a plurality of masking films 230, thereby preventing image distortion.

When a general transparent display device is in an off-state, an image of an object positioned on a side of the transparent display device opposite to a user may be transmitted to the user, not only through patterns of organic light-emitting devices, thin film transistors, and other conductive lines, but also through the spaces therebetween. However, the transmittances of the organic light-emitting device, the thin film transistor, and the other conductive lines may be relatively low and the spaces therebetween may be small, such that the overall transmittance of the general transparent display device may not be high. Also, the image of the object may appear distorted, the distortion being caused by the patterns of the organic light-emitting device, the thin film transistor, and the conductive lines because gaps between the patterns may only be a few, nanometers, which is at a level close to the wavelengths of visible light. Thus, the gaps may scatter light transmitted therethrough.

In contrast, as described above, embodiments may provide a transparent organic light-emitting display device, in which image distortion is prevented by suppressing scattering of light transmitted therethrough. According to embodiments, it may be possible to prevent image distortion and color separation by preventing conductive lines from acting as multiple slits that cause a part of external light to scatter.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. An organic light-emitting display device, comprising:
a substrate, the substrate having a plurality of transmitting regions and having a plurality of pixel regions separated from each other by the transmitting regions interposed between the pixel regions;
a plurality of thin film transistors, the thin film transistors being respectively disposed in the plurality of pixel regions;
a plurality of conductive lines disposed to cross the plurality of transmitting regions, the conductive lines being respectively electrically connected to the plurality of thin film transistors;
a passivation layer covering the plurality of thin film transistors and the plurality of conductive lines;
a plurality of pixel electrodes on the passivation layer, the pixel electrodes being respectively electrically connected to the plurality of thin film transistors and disposed in the plurality of pixel regions, and overlapping with the plurality of thin film transistors so as to cover the plurality of thin film transistors;
an opposite electrode facing the plurality of pixel electrodes, the opposite electrode being configured to allow light to pass therethrough, and disposed in all the plurality of transmitting regions and the plurality of pixel regions;
an organic layer disposed among the plurality of pixel electrodes and the opposite electrode, the organic layer including an emission layer; and
a plurality of masking films disposed in the plurality of transmitting regions to overlap with the plurality of conductive lines so as to cover the plurality of conductive lines, the masking films being electrically insulated from the plurality of conductive lines,
wherein optical transmission through the device of an external light is permitted via an area within the transmitting region, and
wherein the area, where the optical transmission through the device of the external light is permitted, does not overlap with the pixel electrodes.

2. The organic light-emitting display device as claimed in claim 1, wherein an area of each of the plurality of pixel electrodes is equal to an area of one of the plurality of pixel regions.

3. The organic light-emitting display device as claimed in claim 1, wherein at least one of the plurality of conductive lines overlaps with the plurality of pixel electrodes, respectively.

4. The organic light-emitting display device as claimed in claim 1, wherein a ratio of an area of the plurality of transmitting regions to an overall area of the plurality of transmitting regions and the plurality of pixel regions is about 5% to about 90%.

5. The organic light-emitting display device as claimed in claim 1, wherein the passivation layer is formed of a transparent material.

6. The organic light-emitting display device as claimed in claim 1, wherein the pixel electrodes are reflection type electrodes.

7. The organic light-emitting display device as claimed in claim 1, wherein the masking films are formed of a metal material.

8. The organic light-emitting display device as claimed in claim 1, wherein the masking films are disposed on the passivation layer to be separated from the plurality of pixel electrodes.

9. The organic light-emitting display device as claimed in claim 1, further comprising a plurality of transmitting windows disposed adjacent to at least one of the plurality of pixel electrodes between adjacent masking films.

10. The organic light-emitting display device as claimed in claim 1, wherein a first surface of the passivation layer is in direct contact with the plurality of conductive lines and with the plurality of thin film transistors, and a second surface of the passivation layer is in direct contact with the plurality of masking films, the first and second surfaces of the passivation layer being opposite each other.

11. The organic light-emitting display device as claimed in claim 1, wherein the plurality of masking films completely overlap the plurality of conductive lines in the transmitting regions.

12. An organic light-emitting display device, comprising:
a substrate, the substrate having a plurality of transmitting regions and having a plurality of pixel regions separated from each other by the transmitting regions interposed between the pixel regions;
a plurality of pixel circuit units on the substrate, each of the pixel circuits including at least one thin film transistor, the pixel circuit units being respectively positioned in the plurality of pixel regions;
a plurality of conductive lines disposed to cross the plurality of transmitting regions, the conductive lines being respectively electrically connected to the plurality of pixel circuit units;
a first insulating layer covering the plurality of pixel circuit units and the plurality of conductive lines, the first insulating layer being disposed in all the plurality of transmitting regions and the plurality of pixel regions;
a plurality of pixel electrodes on the first insulating layer, the pixel electrodes being respectively electrically connected to the plurality of pixel circuit units, and overlapping with the plurality of pixel circuit units so as to cover the plurality of pixel circuit units;
an opposite electrode facing the plurality of pixel electrodes, the opposite electrode being configured to allow light to pass therethrough, and disposed in all the plurality of transmitting regions and the plurality of pixel regions;

an organic layer disposed among the plurality of pixel electrodes and the opposite electrode, the organic layer being configured to emit light; and a plurality of masking films disposed in the plurality of transmitting regions to overlap with the plurality of conductive lines so as to cover the plurality of conductive lines, the masking films being electrically insulated from the plurality of conductive lines, wherein optical transmission through the device of an external light is permitted via an area within the transmitting region, and wherein the area, where the optical transmission through the device of the external light is permitted, does not overlap with the pixel electrodes.

13. The organic light-emitting display device as claimed in claim 12, wherein the pixel electrodes are disposed in the plurality of pixel regions, respectively.

14. The organic light-emitting display device as claimed in claim 12, wherein at least one of the plurality of conductive lines is disposed to cross the plurality of pixel regions.

15. The organic light-emitting display device as claimed in claim 12, wherein a ratio of an area of the plurality of transmitting regions to an overall area of the plurality of transmitting regions and the plurality of pixel regions is about 5% to about 90%.

16. The organic light-emitting display device as claimed in claim 12, wherein the first insulating layer and a plurality of second insulating layers are disposed in the plurality of transmitting regions and the plurality of pixel regions, and the first insulating layer and the plurality of second insulating layers are formed of a transparent material.

17. The organic light-emitting display device as claimed in claim 12, wherein the pixel electrodes are reflection type electrodes.

18. The organic light-emitting display device as claimed in claim 12, wherein the masking films are formed of a metal material.

19. The organic light-emitting display device as claimed in claim 12, wherein the masking films are disposed on the first insulating layer to be separated from the plurality of pixel electrodes.

20. The organic light-emitting display device as claimed in claim 12, further comprising a plurality of transmitting windows disposed adjacent to at least one of the plurality of pixel electrodes between adjacent masking films.

* * * * *